United States Patent
Hou et al.

(10) Patent No.: US 11,481,051 B2
(45) Date of Patent: Oct. 25, 2022

(54) TOUCH FLEXIBLE PRINTED CIRCUIT, DISPLAY PANEL AND DISPLAY APPARATUS

(71) Applicants: Ordos Yuansheng Optoelectronics Co., Ltd., Inner Mongolia (CN); BOE Technology Group Co., Ltd., Beijing (CN)

(72) Inventors: Baoting Hou, Beijing (CN); Chichang Liu, Beijing (CN); Bin Zhao, Beijing (CN); Guofeng Li, Beijing (CN)

(73) Assignees: Ordos Yuansheng Optoelectronics Co., Ltd., Inner Mongolia (CN); Beijing BOE Technology Development Co., Ltd., Beijing (CN)

(*) Notice: Subject to any disclaimer, the term of this patent is extended or adjusted under 35 U.S.C. 154(b) by 0 days.

(21) Appl. No.: 16/917,924

(22) Filed: Jul. 1, 2020

(65) Prior Publication Data
US 2021/0055811 A1  Feb. 25, 2021

(30) Foreign Application Priority Data

Aug. 21, 2019 (CN) .......................... 201910775097.6

(51) Int. Cl.
*G06F 3/041* (2006.01)
*H01L 27/32* (2006.01)
(52) U.S. Cl.
CPC ............ *G06F 3/041* (2013.01); *H01L 27/323* (2013.01); *G06F 2203/04102* (2013.01)

(58) Field of Classification Search
None
See application file for complete search history.

(56) References Cited

U.S. PATENT DOCUMENTS

| 10,520,978 | B1 | 12/2019 | Li et al. |
| 2015/0192961 | A1 | 7/2015 | Zhou |
| 2017/0038799 | A1* | 2/2017 | Delaporte ............ G06F 1/1649 |
| 2017/0118838 | A1* | 4/2017 | Williams ................ H05K 3/32 |
| 2017/0364194 | A1* | 12/2017 | Jang .................... H01L 27/3262 |

FOREIGN PATENT DOCUMENTS

| CN | 103247233 A | 8/2013 |
| CN | 108170314 A | 6/2018 |
| CN | 108766249 A | 11/2018 |

OTHER PUBLICATIONS

Office Action dated May 9, 2020 for Chinese Patent Application No. 201910775097.6 and English Translation.

* cited by examiner

*Primary Examiner* — Amare Mengistu
*Assistant Examiner* — Sarvesh J Nadkarni
(74) *Attorney, Agent, or Firm* — Ling Wu; Stephen Yang; Ling and Yang Intellectual Property

(57) ABSTRACT

Disclosed are a touch flexible printed circuit, a display panel and a display apparatus. The touch flexible printed circuit includes at least two unfoldable portions and at least one foldable portion, the foldable portion is located between and connected to adjacent unfoldable portions, and the foldable portion is configured to make the adjacent unfoldable portions at least partially overlap to form a fold portion, when the foldable portion is folded.

13 Claims, 3 Drawing Sheets

TOUCH FLEXIBLE PRINTED CIRCUIT, DISPLAY PANEL AND DISPLAY APPARATUS

CROSS-REFERENCE TO RELATED APPLICATION

This application claims the priority of Chinese Patent Application No. 201910775097.6 filed to the CNIPA on Aug. 21, 2019, the content of which is hereby incorporated by reference.

TECHNICAL FIELD

The present disclosure relates to, but is not limited to, the field of display technology, in particular to a touch flexible printed circuit, a display panel and a display apparatus.

BACKGROUND

Organic Light Emitting Diode (OLED) display apparatuses have the advantages such as ultra-thinness, large viewing angle, active light emission, high brightness, continuous and adjustable color of emitted light, low cost, fast response, low power consumption, wide operating temperature range and flexible display, and have gradually become a promising next generation display technology.

In the display technology, there are mainly three methods to realize touch control in technology, namely On-Cell, In-cell and Out-cell. The On-cell mode is one of the most widely used methods for realizing touch control function in OLED display devices. It has the characteristics of high sensitivity, fast transmission, high accuracy, etc. In the overall product design, Touch Flexible Printed Circuit (TFPC) is one of the main devices to realize the touch control function. Therefore, to optimize the structure design of the touch flexible printed circuit is one of the main directions to realize the improvement of the touch control function.

SUMMARY

The following is a summary of the subject matter described in detail herein. This summary is not intended to limit the scope of protection of the claims.

A touch flexible printed circuit includes at least two unfoldable portions and at least one foldable portion, the foldable portion being located between and connected to adjacent unfoldable portions, and the foldable portion being configured to make the adjacent unfoldable portions at least partially overlap to form a fold portion when the foldable portion is folded.

In an example embodiment, a bending silkscreen printing line is provided between the unfoldable portion and the foldable portion, and is configured for folding the foldable portion to make the foldable portion abutted against the unfoldable portion to form the fold portion.

In an example embodiment, the touch flexible printed circuit includes one foldable portion, and a first unfoldable portion located on one side of the foldable portion, and a second unfoldable portion located on the other side of the foldable portion, a first bending silkscreen printing line is provided between the first unfoldable portion and the foldable portion, and a second bending silkscreen printing line is provided between the second unfoldable portion and the foldable portion.

In an example embodiment, the touch flexible printed circuit includes two unfoldable portions and at least three foldable portions located between the two unfoldable portions, a third bending silkscreen printing line is provided between the foldable portion and the unfoldable portion, and the foldable portion is folded towards the unfoldable portion through the third bending silkscreen printing line.

In an example embodiment, a fourth bending silkscreen printing line is provided between adjacent foldable portions, and the adjacent foldable portions are folded towards each other through the fourth bending silkscreen printing line to form a fold portion with at least five layers.

In an example embodiment, the touch flexible printed circuit includes no less than three unfoldable portions and no less than two foldable portions, and the foldable portion is located between adjacent unfoldable portions.

In an example embodiment, an adhesive layer is provided on the foldable portion, and the foldable portion is adhered to the unfoldable portion through the adhesive layer.

In an example embodiment, the material of the adhesive layer is double-sided adhesive tape.

In an example embodiment, the adhesive layer is provided on both front and back sides of the foldable portion.

In an example embodiment, the bending silkscreen printing line penetrates the touch flexible printed circuit in a width direction of the touch flexible printed circuit.

In an example embodiment, the fold portion has a "Z" shape.

In an example embodiment, a first bonding zone for bonding to a touch film is provided at one end of the touch flexible printed circuit.

In an example embodiment, a second bonding zone for bonding to a glass panel is provided at the other end of the touch flexible printed circuit.

In an example embodiment, the fold portion is located between the first bonding zone and the second bonding zone.

In an example embodiment, a positioning hole is provided on the first bonding zone.

In an example embodiment, the touch flexible printed circuit has a "工" shape.

The present disclosure further provides a display panel, including any one of the aforementioned touch flexible printed circuits.

The present disclosure further provides a display apparatus, including the display panel. Other aspects will become apparent upon reading and understanding the drawings and detailed description.

BRIEF DESCRIPTION OF DRAWINGS

The accompanying drawings are used to provide a further understanding of the technical solutions of the present disclosure and form a portion of the specification. Together with the embodiments of the present disclosure, they are used to explain the technical solutions of the present disclosure and do not constitute a limitation on the technical solutions of the present disclosure. The shapes and sizes of the components in the drawings do not reflect real proportions, and are only for the purpose of schematically describing the contents of the present disclosure.

Figure 1:
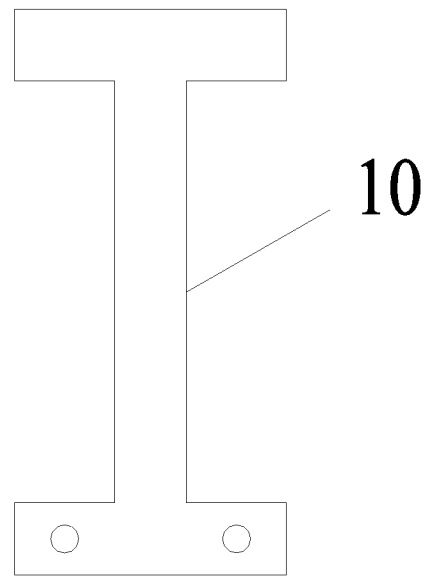
FIG. 1 is a schematic structural view of a touch flexible printed circuit.

Reference signs in the drawings are explained below.

1—unfoldable portion; 2—foldable portion; 3—bending silkscreen printing line; 4—fold portion; 5—adhesive layer; 6—first bonding zone; 7—second bonding zone; 8—positioning hole; 101—first unfoldable portion; 102—second unfoldable portion; 103—third unfoldable portion; 201—first foldable portion; 202—second foldable portion; 301—first bending silkscreen printing line; 302—second bending silkscreen printing line; 303—third bending silkscreen printing line; and 304—fourth bending silkscreen printing line.

DETAILED DESCRIPTION

The embodiments herein may be implemented in a number of different forms. Those of ordinary skills in the art will readily understand the fact that implementations and contents may be transformed into a variety of forms without departing from the spirit and scope of the present disclosure. Therefore, the present disclosure should not be construed as being limited only to what is described in the following embodiments. The embodiments in the present disclosure and the features in the embodiments may be combined with each other arbitrarily if there is no conflict.

Figure 2:
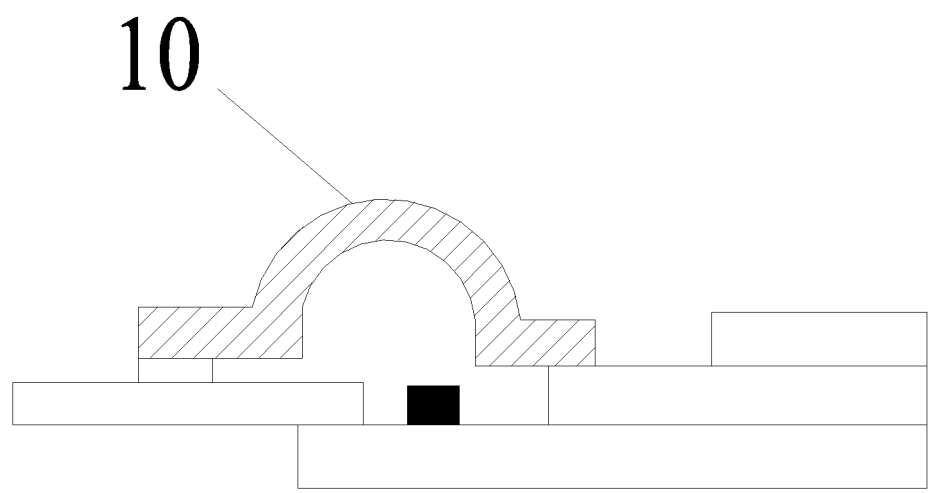
FIG. 2 is a schematic structural view of a touch flexible printed circuit after bonding.

FIG. 1 is a schematic structural view of a touch flexible printed circuit, and FIG. 2 is a schematic structural view of a touch flexible printed circuit after bonding. As shown in FIGS. 1 and 2, one end of the touch flexible printed circuit 10 is provided with a first bonding zone for Touch FPC On Film (TFOF), that is, bonding to a touch film. The other end thereof is provided with a second bonding zone for Touch FPC On Glass (TFOG), that is, bonding to a glass panel. The length dimension design of the touch flexible printed circuit 10 shall take into account a reserved amount for bending protrusion after bonding, that is, the touch flexible printed circuit 10 will undergo bending protrusion after bonding. During the bonding process of the touch flexible printed circuit 10, due to the reserved amount for bending protrusion, the touch flexible printed circuit 10 will be damaged, which greatly increases the process difficulty and stability of the bonding of the touch flexible printed circuit 10.

In addition, the offset of TFOF, that is, the offset during the bonding of the touch flexible printed circuit to the touch film is one of the main causes of the failure of the touch control function. At present, the bonding positioning method of TFOF is to provide a positioning hole on the first bonding zone of the touch flexible printed circuit, and positioning is performed through the positioning hole. However, the reserved amount for bending protrusion of the touch flexible printed circuit will influence the positioning accuracy of the positioning hole, thus seriously affecting the bonding precision of TFOF.

An embodiment of the present disclosure provides a touch flexible printed circuit. The touch flexible printed circuit according to an embodiment of the present disclosure includes at least two unfoldable portions and at least one foldable portion, the foldable portion is located between and connected to adjacent unfoldable portions, and the foldable portion is configured to make the adjacent unfoldable portions at least partially overlap to form a fold portion when the foldable portion is folded.

For a touch flexible printed circuit according to an embodiment of the present disclosure, a reserved amount for bending protrusion of the touch flexible printed circuit is folded by a fold portion so as to reduce the length of the touch flexible printed circuit, and when the bonding process of the touch flexible printed circuit is completed, the folded portion is expanded. In this way, it is possible to completely eliminate the problem that the bonding process will cause damages to the touch flexible printed circuit, which reduces the process difficulty of the bonding of the flexible printed circuit, and improves the bonding stability and product quality of the touch flexible printed circuit. Moreover, the bonding accuracy of the touch flexible printed circuit is improved, preventing the reserved amount for bending protrusion from affecting the positioning accuracy during bonding of the touch flexible printed circuit.

Figure 3:
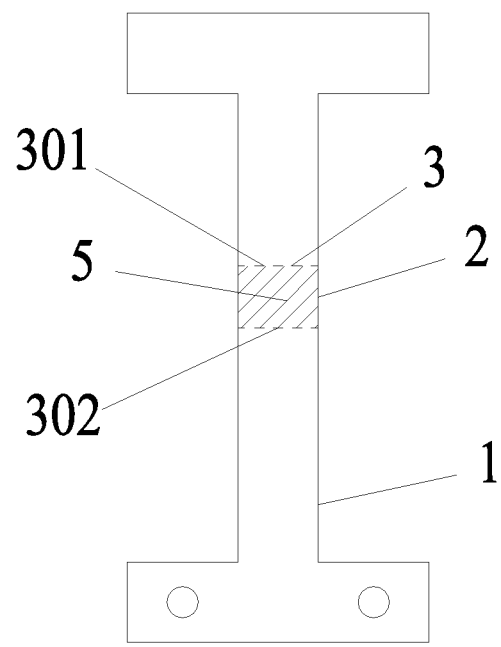
FIG. 3 is a schematic structural view of a touch flexible printed circuit before folding according to the present disclosure.
Figure 4:
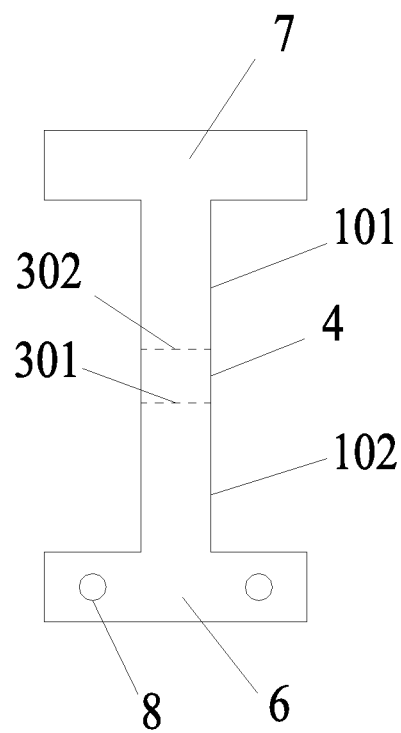
FIG. 4 is a schematic structural view of a touch flexible printed circuit after folding according to the present disclosure.
Figure 5:
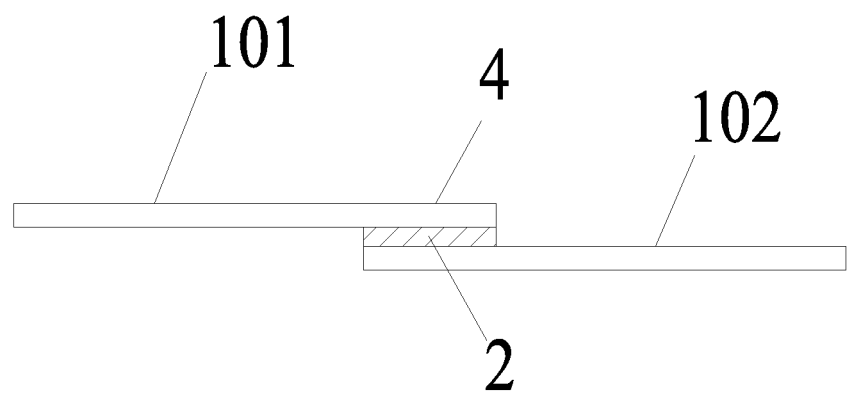
FIG. 5 is a sectional view of a touch flexible printed circuit after folding according to the present disclosure.

FIG. 3 is a schematic structural view of a touch flexible printed circuit before folding according to the present disclosure, FIG. 4 is a schematic structural view of a touch flexible printed circuit after folding according to the present disclosure, and FIG. 5 is a sectional view of a touch flexible printed circuit after folding according to the present disclosure. As shown in FIGS. 3, 4 and 5, the touch flexible printed circuit according to an embodiment of the present disclosure includes two unfoldable portions 1 and one foldable portion 2, and the foldable portion 2 is located between and connected to the two unfoldable portions 1. A bending silkscreen printing line 3 is provided respectively between the foldable portion 2 and the two unfoldable portions 1. The bending silkscreen printing line 3 penetrates the touch flexible printed circuit in a width direction of the touch flexible printed circuit. The foldable portion 2 is folded by the bending silkscreen printing line 3 to be respectively abutted against the two unfoldable portions 1, so that the two unfoldable portions 1 partially overlap to form a fold portion 4. Specifically, the touch flexible printed circuit according to an embodiment of the present disclosure includes a first unfoldable portion 101 and a second unfoldable portion 102 located respectively on both sides of the foldable portion 2. A first bending silkscreen printing line 301 is provided between the first unfoldable portion 101 and the foldable portion 2, and a second bending silkscreen printing line 302 is provided between the second unfoldable portion 102 and the foldable portion 2. While the foldable portion 2 is bent towards the first unfoldable portion 101 by the first bending silkscreen printing line 301, the foldable portion 2 is bent towards the second unfoldable portion 102 by the second bending silkscreen printing line 302, until one side of the foldable portion 2 is abutted against the first unfoldable portion 101, and the other side of the foldable portion 2 is abutted against the second unfoldable portion 102, so that the first unfoldable portion 101 and the second unfoldable portion 102 partially overlap to form a "Z"-shaped fold portion 4, as shown in FIGS. 4 and 5.

As shown in FIGS. 3 and 4, an adhesive layer 5 is provided on the foldable portion 2. When the foldable portion 2 is folded by the bending silkscreen printing line 3 to form the fold portion 4, the foldable portion 2 is adhered to the unfoldable portion 1 by the adhesive layer 5. Specifically, the foldable portion 2 is bent in a direction close to the second unfoldable portion 102 by the second bending silkscreen printing line 302, until the adhesive layer 5 on the foldable portion 2 is abutted against the second unfoldable portion 102, so that the foldable portion 2 is adhered to the second unfoldable portion 102 by the adhesive layer 5. The material of the adhesive layer 5 can be double-sided adhesive tape.

In an example embodiment, the adhesive layer may be provided respectively on the front and back sides of the foldable portion, which will not be described redundantly here in the present disclosure.

In the touch flexible printed circuit according to an embodiment of the present disclosure, the fold portion 4 is fixed by the adhesive layer 5, thereby preventing the fold portion 4 from expanding during the bonding process of the touch flexible printed circuit to affect the bonding stability and product quality of the touch flexible printed circuit. When bonding is completed for the touch flexible printed circuit according to an embodiment of the present disclosure, the adhesive layer 5 on the foldable portion 2 is separated from the unfoldable portion 1 to expand the fold portion 4, thereby eliminating the damages to the touch flexible printed circuit in the bonding process and improving the bonding stability and product quality of the touch flexible printed circuit.

As shown in FIG. 4, the touch flexible printed circuit has a "T."-shape, with both ends being respectively provided with a first bonding zone 6 and a second bonding zone 7, and the fold portion 4 is located between the first bonding zone 6 and the second bonding zone 7. The first bonding zone 6 is provided with a positioning hole 8 through which the first bonding zone 6 is positioned with respect to a touch film. For the touch flexible printed circuit according to an embodiment of the present disclosure, the reserved amount for bending protrusion is folded by the fold portion 4, thereby enhancing the bonding accuracy of the touch flexible printed circuit, and preventing the reserved amount for bending protrusion from affecting the positioning precision of the positioning hole 8 on the touch flexible printed circuit.

As can be seen from the structure of the touch flexible printed circuit according to an embodiment of the present disclosure, the reserved amount for bending protrusion of the touch flexible printed circuit is folded by the fold portion in an embodiment of the present disclosure, so as to reduce the length of the touch flexible printed circuit. The fold portion is expanded after the completion of the bonding process of the touch flexible printed circuit. In this way, it is possible for the touch flexible printed circuit to reserve a reserved amount for bending protrusion, and also eliminate the damages to the touch flexible printed circuit caused by the reserved amount for bending protrusion in the bonding process, which improves the bonding stability and product quality of the touch flexible printed circuit.

Figure 6:
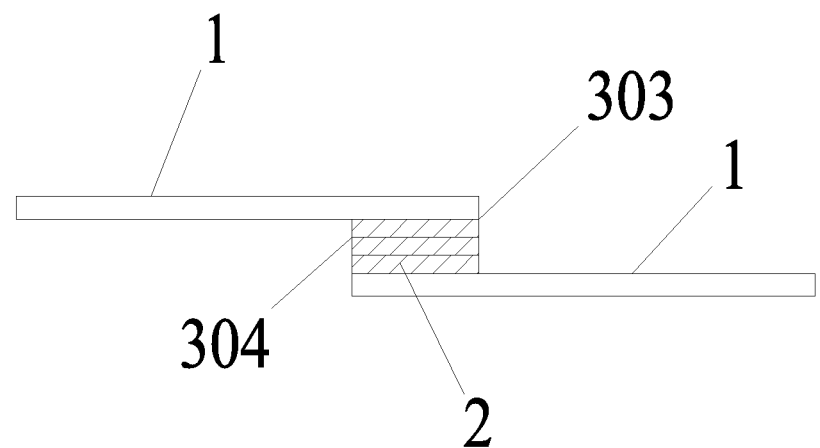
FIG. 6 is a schematic structural view of a touch flexible printed circuit after folding according to the present disclosure.

FIG. 6 is a schematic structural view of a touch flexible printed circuit after folding according to the present disclosure. As shown in FIG. 6, the structure of the touch flexible printed circuit according to an embodiment of the present disclosure is similar to that described in any one of the previous embodiments, except that the touch flexible printed circuit according to an embodiment of the present disclosure includes two unfoldable portions 1 and at least three foldable portions 2 located between the two unfoldable portions 1. A third bending silkscreen printing line 303 is provided between the foldable portion 2 and the unfoldable portion 1, and the foldable portion 2 is folded to the unfoldable portion 1 by the third bending silkscreen printing line 303. A fourth bending silkscreen printing line 304 is provided between adjacent foldable portions 2, and adjacent foldable portions 2 are folded towards each other by the fourth bending silkscreen printing line 304 to form a fold portion which is folded into at least five layers.

The touch flexible printed circuit according to an embodiment of the present disclosure solves the problem of damages to the touch flexible printed circuit due to the reserved amount for bending protrusion of the touch flexible printed circuit.

Figure 7:
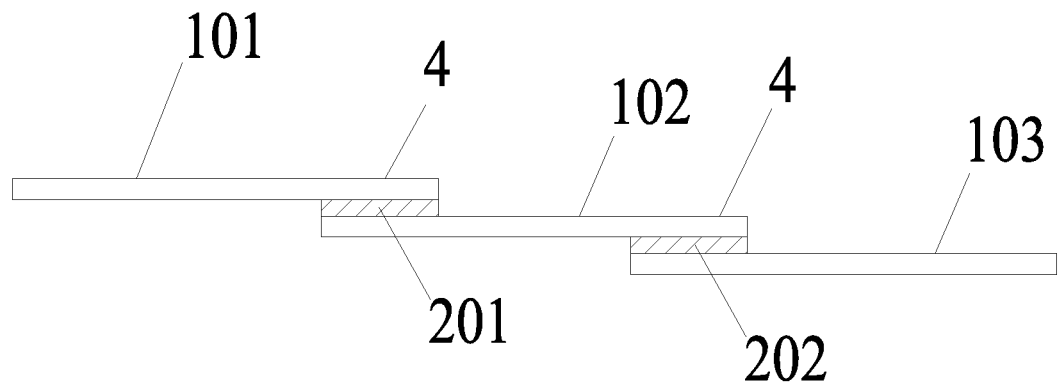
FIG. 7 is a schematic structural view of a touch flexible printed circuit after folding according to the present disclosure.

FIG. 7 is a schematic structural view of a touch flexible printed circuit after folding according to the present disclosure. As shown in FIG. 7, the structure of the touch flexible printed circuit according to an embodiment of the present disclosure is similar to that described in any one of the previous embodiments, except that the touch flexible printed circuit according to an embodiment of the present disclosure includes no less than three unfoldable portions and no less than two foldable portions. Taking the case as an example where the touch flexible printed circuit includes three unfoldable portions and two foldable portions, the touch flexible printed circuit according to an embodiment of the present disclosure includes a first unfoldable portion 101, a second unfoldable portion 102, a third unfoldable portion 103, a first foldable portion 201 and a second foldable portion 202. The first foldable portion 201 is located between the first unfoldable portion 101 and the second unfoldable portion 102, and the second foldable portion 202 is located between the second unfoldable portion 102 and the third unfoldable portion 103. After being folded, the first foldable portion 201 is respectively abutted against the first unfoldable portion 101 and the second unfoldable portion 102. After being folded, the second foldable portion 202 is respectively abutted against the second unfoldable portion 102 and the third unfoldable portion 103 to form two "Z"-shaped fold portions 4.

The touch flexible printed circuit according to an embodiment of the present disclosure solves the problem of damages to the touch flexible printed circuit due to the reserved amount for bending protrusion of the touch flexible printed circuit.

An embodiment of the present disclosure further provides a display panel, including any one of the aforementioned touch flexible printed circuits.

An embodiment of the present disclosure further provides a display apparatus, including any one of the aforementioned display panels. The display apparatus may be any product or component with a display function such as a mobile phone, a tablet computer, a television, a display, a notebook computer, a digital photo frame, a navigator, etc.

In the description of the present disclosure, it should be understood that the azimuth or position relationship indicated by the terms "middle", "upper", "lower", "front", "rear", "vertical", "horizontal", "top", "bottom", "inner", "outer" and the like is based on the azimuth or position relationship shown in the drawings, which is only for the convenience of describing the present disclosure and simplifying the description, rather than indicating or implying that the apparatus or element referred to must have the specific orientation, or be constructed and operated in the specific orientation, and thus cannot be interpreted as a limitation on the present disclosure.

In the description of the present disclosure, it should be noted that, unless otherwise clearly specified or defined, the term "install", "connect" or "link" should be broadly interpreted, for example, it may be fixed connection, detachable connection, or integral connection; it may be a mechanical connection or an electrical connection; and it may be direct connection, indirect connection through an intermediary, or an internal connection between two elements. Those of ordinary skills in the art can understand the specific meanings of the above terms in the present disclosure according to specific situations.

Although the embodiments disclosed in the present disclosure are as described above, the described contents are only the embodiments for facilitating understanding of the present disclosure, which are not intended to limit the present disclosure. Any person skilled in the art to which the present disclosure pertains can make any modifications and variations in the form and details of implementation without departing from the spirit and scope of the present disclosure. Nevertheless, the scope of patent protection of the present application shall still be determined by the scope as defined in the appended claims.

What we claim is:

1. A touch flexible printed circuit, comprising at least two unfoldable portions and at least one foldable portion, wherein
   the foldable portion is located between and connected to adjacent unfoldable portions;
   the foldable portion is configured to make the adjacent unfoldable portions at least partially overlap to form a fold portion when the foldable portion is folded;
   a bending silkscreen printing line is provided between the unfoldable portion and the foldable portion, and is configured for folding the foldable portion to make the foldable portion abutted against the unfoldable portion to form the fold portion;
   the bending silkscreen printing line penetrates the touch flexible printed circuit in a width direction of the touch flexible printed circuit,
   a first bonding zone for bonding to a touch film is provided at one end of the touch flexible printed circuit,
   a second bonding zone for bonding to a glass panel is provided at the other end of the touch flexible printed circuit,
   the fold portion is located between the first bonding zone and the second bonding zone; and
   a reserved amount for bending a protrusion of the touch flexible printed circuit is folded by the fold portion, a length of the touch flexible printed circuit is reduced.

2. The touch flexible printed circuit according to claim 1, wherein the touch flexible printed circuit comprises one foldable portion, and a first unfoldable portion located on one side of the foldable portion, and a second unfoldable portion located on the other side of the foldable portion, a first bending silkscreen printing line is provided between the first unfoldable portion and the foldable portion, and a second bending silkscreen printing line is provided between the second unfoldable portion and the foldable portion.

3. The touch flexible printed circuit according to claim 1, wherein the touch flexible printed circuit comprises two unfoldable portions and at least three foldable portions located between the two unfoldable portions, a third bending silkscreen printing line is provided between the foldable portion and the unfoldable portion, and the foldable portion is folded towards the unfoldable portion through the third bending silkscreen printing line.

4. The touch flexible printed circuit according to claim 3, wherein a fourth bending silkscreen printing line is provided between adjacent foldable portions, and the adjacent foldable portions are folded towards each other through the fourth bending silkscreen printing line to form a fold portion with at least five layers.

5. The touch flexible printed circuit according to claim 1, wherein the touch flexible printed circuit comprises no less than three unfoldable portions and no less than two foldable portions, and the foldable portion is located between adjacent unfoldable portions.

6. The touch flexible printed circuit according to claim 1, wherein an adhesive layer is provided on the foldable portion, and the foldable portion is adhered to the unfoldable portion through the adhesive layer.

7. The touch flexible printed circuit according to claim 6, wherein material of the adhesive layer is double-sided adhesive tape.

8. The touch flexible printed circuit according to claim 6, wherein the adhesive layer is provided on both front and back sides of the foldable portion.

9. The touch flexible printed circuit according to claim 1, wherein the fold portion has a "Z" shape.

10. The touch flexible printed circuit according to claim 1, wherein a positioning hole is provided on the first bonding zone.

11. The touch flexible printed circuit according to claim 1, wherein the touch flexible printed circuit has a "⊥" shape.

12. A display panel, comprising the touch flexible printed circuit according to claim 1.

13. A display apparatus, comprising the display panel according to claim 12.

* * * * *